United States Patent
Matsumoto et al.

(10) Patent No.: US 8,835,778 B2
(45) Date of Patent: Sep. 16, 2014

(54) GROMMET AND METHOD OF MOUNTING THEREOF

(75) Inventors: Manabu Matsumoto, Okazaki (JP); Yoshitsuna Sugiura, Toyota (JP); Shunji Nishihara, Toyota (JP)

(73) Assignee: Toyota Jidosha Kabushiki Kaisha, Toyota-shi, Aichi (JP)

( * ) Notice: Subject to any disclaimer, the term of this patent is extended or adjusted under 35 U.S.C. 154(b) by 0 days.

(21) Appl. No.: 13/978,555

(22) PCT Filed: Jan. 14, 2011

(86) PCT No.: PCT/JP2011/050524
§ 371 (c)(1),
(2), (4) Date: Jul. 8, 2013

(87) PCT Pub. No.: WO2012/095986
PCT Pub. Date: Jul. 19, 2012

(65) Prior Publication Data
US 2013/0292158 A1    Nov. 7, 2013

(51) Int. Cl.
*H02G 3/22* (2006.01)
*B60R 16/02* (2006.01)
*H02G 3/04* (2006.01)
*H05K 13/00* (2006.01)

(52) U.S. Cl.
CPC .............. *H02G 3/0487* (2013.01); *H02G 3/22* (2013.01); *B60R 16/0222* (2013.01); *H05K 13/00* (2013.01)
USPC .................. 174/650; 174/152 G; 174/153 G; 248/56; 16/2.1; 16/2.2; 277/602

(58) Field of Classification Search
CPC ............ B60R 16/0216; B60R 16/0207; B60R 16/0222; H02G 3/04; H02G 3/22; H02G 3/24; H02G 3/30; H02G 3/36; H02G 3/00; H02G 3/0487; H05K 13/00
USPC .... 174/650, 152 G, 153 G, 135, 137 R, 72 A, 174/68.1, 68.3, 142; 16/2.1, 2.2; 248/56; 277/314, 602, 607, 628; 29/592.1
See application file for complete search history.

(56) References Cited

U.S. PATENT DOCUMENTS

| 4,959,509 A | * | 9/1990 | Takeuchi et al. | .......... 174/153 G |
| 5,635,678 A | * | 6/1997 | Yasukuni | .................. 174/152 G |

(Continued)

FOREIGN PATENT DOCUMENTS

| EP | 2 246 950 | 11/2010 |
| FR | 2904398 | 2/2008 |

(Continued)

*Primary Examiner* — Angel R Estrada
(74) *Attorney, Agent, or Firm* — Finnegan, Henderson, Farabow, Garrett & Dunner, LLP

(57) ABSTRACT

A grommet (10) according to an embodiment of the present invention includes a wire harness connecting part (11) which is liquid-tightly connected to a wire harness (20), a panel connecting part (13) which can be liquid-tightly connected to a panel opening (31), an extending part (12) shape-changeably extending between the wire harness connecting part (11) and the panel connecting part (13), and an extending-part-shape maintaining part (12a) which maintains a shape of the extending part (12) in a state where a distance between the wire harness connecting part (11) and the panel connecting part (13) in a length direction of the wire harness (20) is shorter than that of the case where the panel connecting part (13) is liquid-tightly connected to the panel opening (31).

5 Claims, 8 Drawing Sheets

(56) References Cited

U.S. PATENT DOCUMENTS

| | | | |
|---|---|---|---|
| 6,637,070 B2 * | 10/2003 | Katayama et al. | 174/153 G |
| 6,822,165 B2 * | 11/2004 | Nishimoto | 174/650 |
| 6,927,338 B2 * | 8/2005 | Shimola et al. | 174/152 G |
| 8,299,364 B2 * | 10/2012 | Suzuki et al. | 174/152 G |
| 8,502,079 B2 * | 8/2013 | Shitamichi | 174/152 G |
| 8,563,878 B2 * | 10/2013 | Suzuki | 174/650 |
| 2001/0006464 A1 | 7/2001 | Sawayanagi | |
| 2008/0230257 A1 | 9/2008 | Kawasaki et al. | |

FOREIGN PATENT DOCUMENTS

| | | |
|---|---|---|
| JP | 9-284953 | 10/1997 |
| JP | 2000-358315 | 12/2000 |
| JP | 2001-186623 | 7/2001 |
| JP | 2001-309528 | 11/2001 |
| JP | 2003-111249 | 4/2003 |
| JP | 2005-225433 | 8/2005 |
| JP | 2008-234904 | 10/2008 |

* cited by examiner

GROMMET AND METHOD OF MOUNTING THEREOF

CROSS-REFERENCE TO RELATED APPLICATIONS

This application is a national phase application of International Application No. PCT/JP2011/050524, filed Jan. 14, 2011, the content of which is incorporated herein by reference.

TECHNICAL FIELD

The present invention relates to a grommet attached to a wire harness and a method of mounting the grommet to a panel opening. In particular, the present invention relates to a grommet which is able to make room for a work space for attaching a connector at a tip of the wire harness to a corresponding connector in a junction box placed in the panel opening and a method of mounting the grommet to the panel opening.

BACKGROUND ART

Conventionally, a waterproof grommet attached to a wire harness for improving the connecting workability of a connector at a panel opening is known (see Patent Document 1 for example).

This waterproof grommet is configured to be fixed to a panel by using two bolts. When the connector is connected to the corresponding connector, the waterproof grommet is rotated 90 degrees with respect to a normal fixed position about a bolt axis as a rotational axis. Thus, a waterproof grommet body is displaced from the panel opening. As a result, the waterproof grommet can make room for a space for a connecting procedure of the connectors.

Also, a side wall of this waterproof grommet is comprised of a stretchable bellows part. The waterproof grommet can completely expose the connectors within the bellows when the bellows are compressed. As a result, the waterproof grommet can rotate about the bolt axis as the rotational axis while avoiding interference with the connectors.

PRIOR ART DOCUMENTS

Patent Document

[Patent Document 1] Japanese Patent Publication No. 2001-309528

SUMMARY OF THE INVENTION

Problems to be Solved by the Invention

However, in a case of mounting the waterproof grommet in Patent Document 1 to the panel opening, a worker has to compress the bellows part of the waterproof grommet to avoid interference between the side wall of the waterproof grommet and the connectors when the worker rotates the waterproof grommet about the bolt axis as the rotational axis to make room for a space for the connecting procedure of the connectors, or when the worker returns the rotated waterproof grommet to the normal fixed position after the connection procedure of the connectors has been completed. Thus, it cannot be said that the connecting workability has sufficiently improved.

Also, even if the worker makes room for the work space by rotating the waterproof grommet by 90 degrees, the worker cannot completely avoid the interference between a flange part of the waterproof grommet and the connectors. Thus, also in this regard, it cannot be said that the connecting workability has sufficiently improved.

In consideration of the above point, the present invention is intended to provide a grommet which further improves the connecting workability of a connector and a method of mounting the grommet to a panel opening.

Means for Solving Problems

To achieve the above objective, a grommet according to an embodiment of the present invention includes a wire harness connecting part configured to be liquid-tightly connected to a wire harness, a panel connecting part configured to be able to be liquid-tightly connected to a panel opening, an extending part configured to shape-changeably extend between the wire harness connecting part and the panel connecting part, and an extending-part-shape maintaining part configured to maintain a shape of the extending part in a state where a distance between the wire harness connecting part and the panel connecting part in a length direction of the wire harness is shorter than that of the case where the panel connecting part is liquid-tightly connected to the panel opening.

Also, a method of mounting a grommet to a panel opening according to an embodiment of the present invention, the grommet comprising a wire harness connecting part configured to be liquid-tightly connected to a wire harness, a panel connecting part configured to be able to be liquid-tightly connected to a panel opening, an extending part configured to shape-changeably extend between the wire harness connecting part and the panel connecting part, and an extending-part-shape maintaining part configured to maintain a shape of the extending part, includes steps of connecting a connector at a tip of the wire harness and a corresponding connector disposed in the panel opening while maintaining by the extending-part-shape maintaining part the shape of the extending part in a state where a distance between the wire harness connecting part and the panel connecting part in a length direction of the wire harness is shorter than that of the case where the panel connecting part is liquid-tightly connected to the panel opening, and coupling the panel connecting part to the panel opening by lengthening the distance through changing the shape of the extending part.

Effects of the Invention

According to the above means, the present invention can provide a grommet which further improves the connecting workability of a connector and a method of mounting the grommet to a panel opening.

MODE FOR CARRYING OUT THE INVENTION

With reference to figures, a mode for carrying out the present invention will be explained below.

[Embodiment 1]

Figure 1:
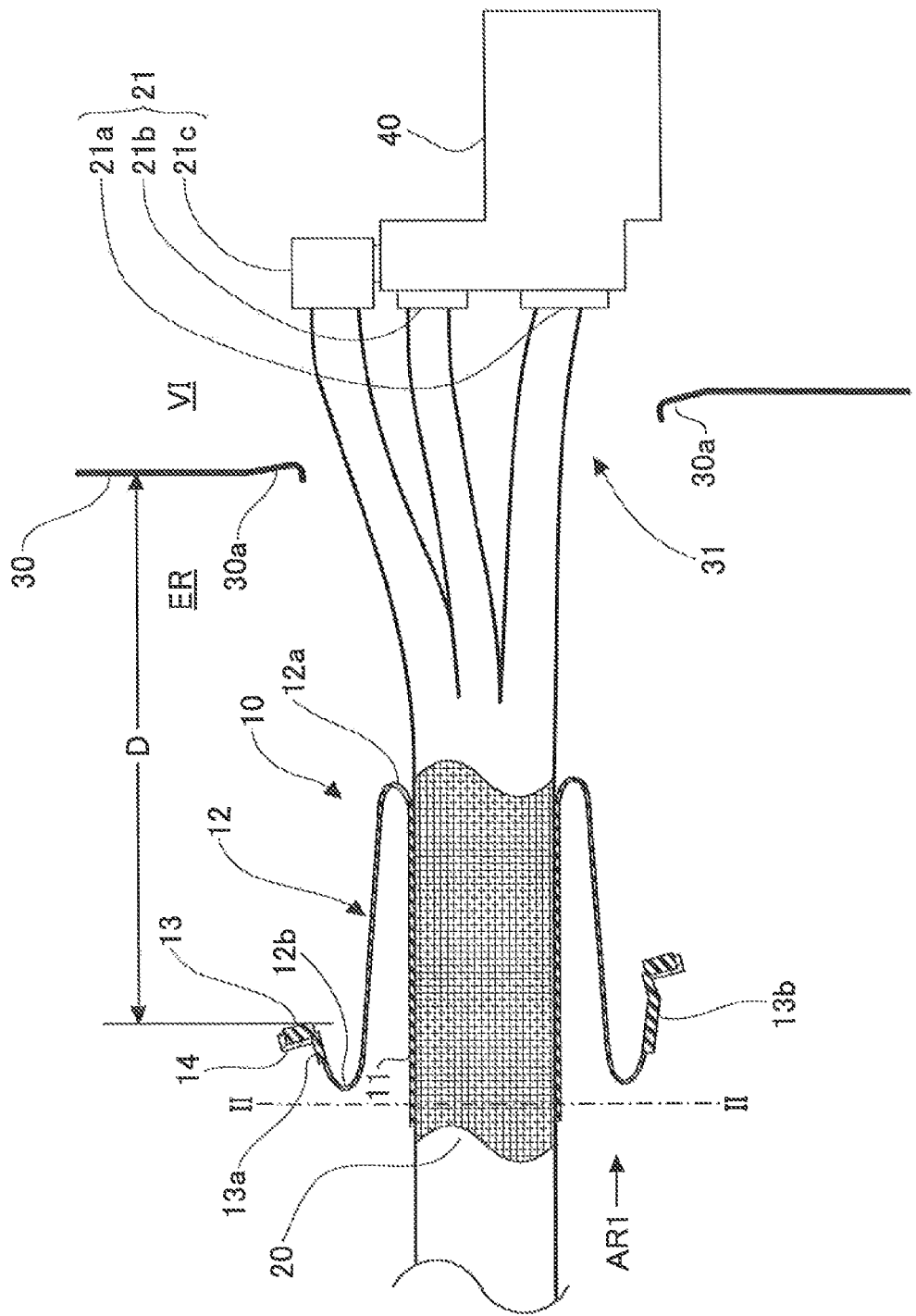
FIG. 1 is a partial cross-sectional view illustrating a configuration example of a grommet according to an embodiment of the present invention (before it is connected to a panel).
Figure 2:
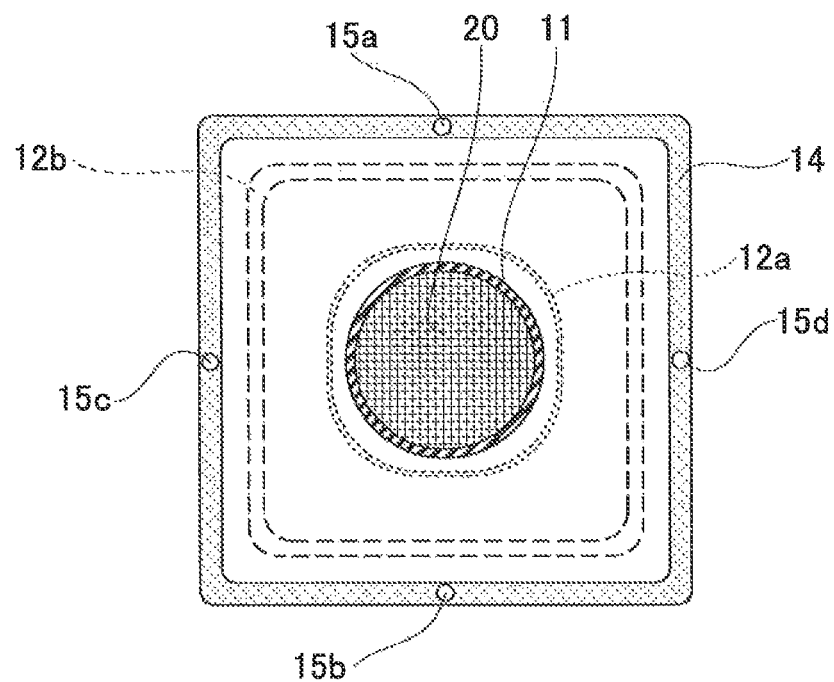
FIG. 2 is a diagram illustrating a plane defined by a line II-II in FIG. 1 viewed from a direction of an arrow AR1.

FIG. 1 is a partial cross-sectional view illustrating a configuration example of a grommet 10 according to an embodiment of the present invention, in which a whole extent of the grommet 10 and a part of a wire harness 20 are seen in cross-section (shadow areas). FIG. 1 shows a state before the grommet 10 attached to the wire harness 20 is connected to a dash panel 30. Connectors 21 (21a, 21b, and 21c), at a tip of the wire harness 20 to which the grommet 10 is attached, pass through a panel opening 31 of the dash panel 30 from an engine room ER side at a front part of a vehicle. Also, the connectors 21 have been connected to corresponding connectors in a junction box 40 of an instrument panel installed in a vehicle interior VI (a space where an air conditioning unit and the like are installed). FIG. 2 is a diagram illustrating a plane defined by a line II-II in FIG. 1 viewed from a direction of an arrow AR1.

The grommet 10 is a member made of synthetic rubber such as Ethylene Propylene Diene Monomer (EPDM) rubber. The grommet 10 is mainly comprised of a wire harness connecting part 11, an intermediate extending part 12, and a panel connecting part 13.

The wire harness connecting part 11 is configured to be connected to an outer periphery of the wire harness 20 liquid-tightly. For example, the wire harness connecting part 11 has a cylindrical shape, and is bonded to the wire harness 20 liquid-tightly by applying an adhesive such as a modified silicone resin adhesive between an outer surface of the wire harness 20 and an inner surface of the wire harness connecting part 11.

The wire harness connecting part 11 may be cured in a shape which fits into the wire harness 20 (typically a cylindrical shape) at a state where it remains connected to the wire harness 20.

The intermediate extending part 12 is a shape-changeable flexible part extending between the wire harness connecting part 11 and the panel connecting part 13. For example, the intermediate extending part 12 has an extending-part-shape maintaining part 12a for maintaining its shape in a reflexed state (a rolled-up state) to a direction opposite to an extending direction of the wire harness 20 (opposite to a direction facing the tip where there are the connectors 21).

The extending-part-shape maintaining part 12a is made of the same material (for example, EPDM rubber) as other parts (the wire harness connecting part 11 and the panel connecting part 13) of the grommet 10. The extending-part-shape maintaining part 12a is configured so that it can maintain the rolled-up state of the intermediate extending part 12 as shown in FIG. 1. For example, the extending-part-shape maintaining part 12a is configured to be thicker than other parts or to be coated with a curing agent so that it can maintain its shape, regardless of the state of the intermediate extending part 12 (regardless whether it is rolled up or not).

Preferably, the grommet 10 is supplied in a state where the intermediate extending part 12 has been rolled up. This is to allow the worker to begin the connecting procedure of the connectors without the need to roll up the intermediate extending part 12 manually.

The panel connecting part 13 is configured to be connected to the periphery of the panel opening 31 of the dash panel 30 liquid-tightly. For example, the panel connecting part 13 has an opening which fits into a shape of the periphery of the panel opening 31 (for example, a rectangle). Also, the periphery of the panel connecting part 13 is reinforced by a plate part 14 so that the periphery can enable fastening by a fastener member such as a bolt.

The panel connecting part 13 ensures rigidity higher than that of the intermediate extending part 12 by making a joint part 13a, 13b attached to the intermediate extending part 12 thicker than the intermediate extending part 12. In case where the intermediate extending part 12 is rolled up as shown in FIG. 1, the panel connecting part 13 helps the intermediate extending part 12 form a curved part 12b which reflexes the intermediate extending part 12, which has been rolled up by the extending-part-shape maintaining part 12a in the direction opposite to the extending direction of the wire harness 20, again in the extending direction of the wire harness 20 in the immediate vicinity of the joint part 13a, 13b.

As a result, in case where the intermediate extending part 12 is rolled up as shown in FIG. 1, the panel connecting part 13 is held in a position away from the dash panel 30 more than a predetermined distance D (for example, 150 mm) at a state where the connectors 21 of the wire harness 20 are connected to the corresponding connectors in the junction box 40. Thus, the panel connecting part 13 allows the grommet 10 to make room for a work space (a space into which the worker can insert his/her hand, also referred to as "hand space") required for the worker to connect the connectors 21 of the wire harness 20 to the corresponding connectors in the junction box 40.

The plate part 14 is configured to reinforce the periphery of the panel connecting part 13. For example, the plate part 14 is made of metal such as an iron, and fastened, together with the panel connecting part 13, to the dash panel 30 by the fastener member such as a bolt.

In the present embodiment, the panel connecting part 13 (the plate part 14) has a rectangle shape which fits into the shape (the rectangle shape) of the periphery of the panel opening 31 as shown in FIG. 2. However, if the panel connecting part 13 (the plate part 14) can seal the panel opening 31 liquid-tightly, it does not necessarily fit into the shape of the panel opening 31, so that it may have an opening having other shapes such as a circular shape, an elliptical shape, a polygonal shape, or the like.

Also, in the present embodiment, the wire harness 20 is provided with three connectors 21a, 21b, and 21c at its tip. These connectors pass through the single panel opening 31 and are connected to the corresponding connectors in the junction box 40. However, the wire harness 20 may be provided with one or two connectors at its tip, or may be provided with more than three connectors.

Figure 3:
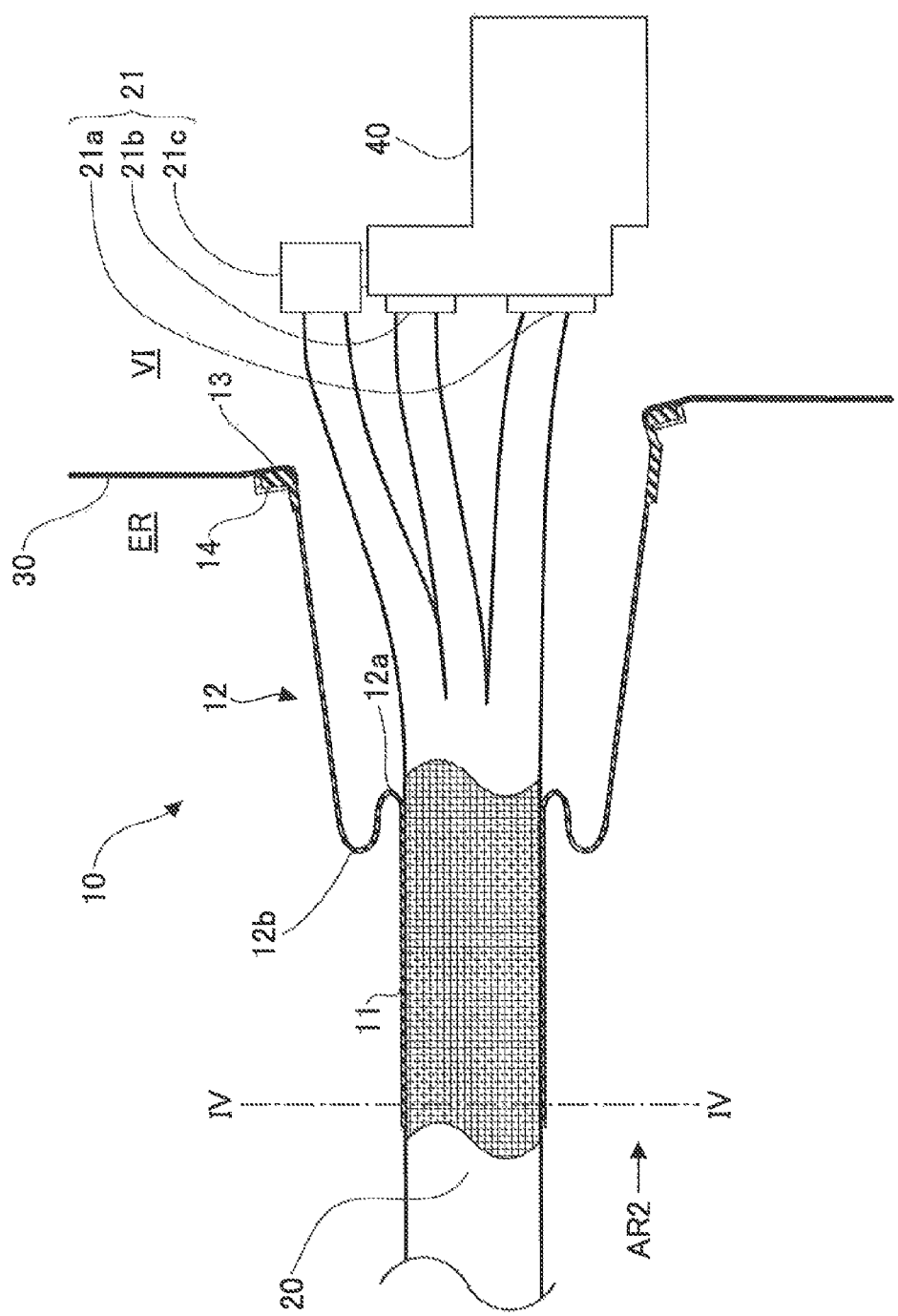
FIG. 3 is a partial cross-sectional view illustrating a state of the grommet in FIG. 1 after it is connected to the panel.
Figure 4:
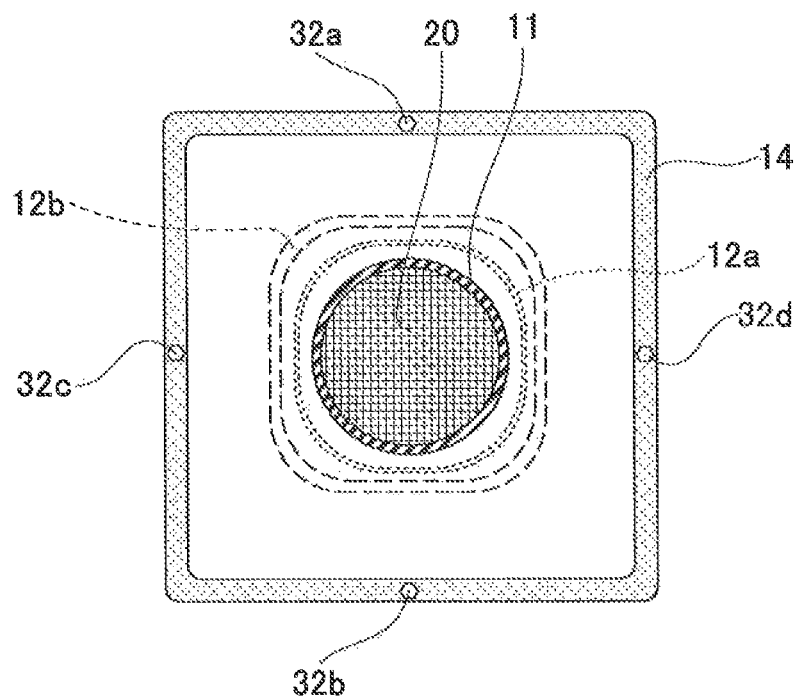
FIG. 4 is a diagram illustrating a plane defined by a line IV-IV in FIG. 3 viewed from a direction of an arrow AR2.

Along with FIG. 1, FIG. 3 is a partial cross-sectional view illustrating a configuration example of the grommet 10 according to the embodiment of the present invention. FIG. 3 shows a state after the grommet 10 has been connected to the dash panel 30. Also, FIG. 4 is a diagram illustrating a plane defined by a line IV-IV in FIG. 3 viewed from a direction of an arrow AR2.

After the worker has connected the connectors 21 of the wire harness 20 to the corresponding connectors in the junction box 40 manually, the worker rolls out the intermediate extending part 12, which has been rolled up as shown in FIG. 1, in a direction toward the dash panel 30. Then, the worker brings the panel connecting part 13 into close contact with an engine-room-side surface 30a (see FIG. 1) at the periphery of the panel opening 31 of the dash panel 30. And then, the worker fastens the panel connecting part 13, together with the plate part 14, to the dash panel 30 by using bolts 32a-32d (see FIG. 4) inserted into respective bolt holes 15a-15d (see FIG. 2) which pierce through the panel connecting part 13 and the plate part 14.

As shown in FIGS. 1 and 3, the extending-part-shape maintaining part 12a maintains its shape (a state where it is reflexed in the opposite direction to the extending direction of the wire harness 20) both in the case where the intermediate extending part 12 has been rolled up in the opposite direction to the direction toward the dash panel 30 and the case where the intermediate extending part 12 has been rolled out in the direction toward the dash board 30.

Thus, if the intermediate extending part 12 has been rolled out in the direction toward the dash panel 30 as shown in FIG. 3, it forms the curved part 12b by reversing its extending direction to the extending direction of the wire harness 20 at a point nearby the extending-part-shape maintaining part 12a which is in a state reflexed to the direction opposite to the extending direction of the wire harness 20, and then extends toward the dash panel 30.

Also, the worker can return the intermediate extending part 12 to the rolled-up state shown in FIG. 1 by manually rolling up again the intermediate extending part 12 which has been rolled out toward the dash panel 30 as shown in FIG. 3, by taking advantage of a characteristic of the extending-part-shape maintaining part 12a which maintains its shape regardless of a state of the intermediate extending part 12.

Due to the above configuration, the grommet 10 can hold the intermediate extending part 12 in the rolled-up state to the direction opposite to the extending direction of the wire harness 20 when the worker connects the connectors 21 of the wire harness 20 to the corresponding connectors in the junction box 40. Thus, the grommet 10 can make room for a work space for the connecting procedure without a special manual procedure by the worker, and can further improve the workability.

Also, the grommet 10 can go back and forth repeatedly between a state where the intermediate extending part 12 has been rolled up and a state where the intermediate extending part 12 has been rolled out. Thus, the worker can make room for a work space by rolling up the intermediate extending part 12 even in the case where the worker starts over the connecting procedure of the connectors 21 of the wire harness 20 again after the worker has rolled out the intermediate extending part 12.

Also, the intermediate extending part 12 is held in a state where the panel connecting part 13 has been eventually directed toward the dash panel 30 by reversing its extending direction at two points, i.e., at the extending-part-shape maintaining part 12a and at the curved part 12b. However, the intermediate extending part 12 may be, without forming the curved part 12b, held in a state where the panel connecting part 13 has been rolled up and directed to a direction opposite to the direction toward the dash panel 30 (a state where the intermediate extending part 12 and the panel connecting part 13 have been turned inside out completely in comparison to a state where the panel connecting part 13 is connected to the dash panel 30).

[Embodiment 2]

Next, referring to FIGS. 5-8, a grommet 10A according to another embodiment of the present invention will be described. Components common to the grommet 10 shown in FIGS. 1-4 are referred to by the same reference numerals.

Figure 5:
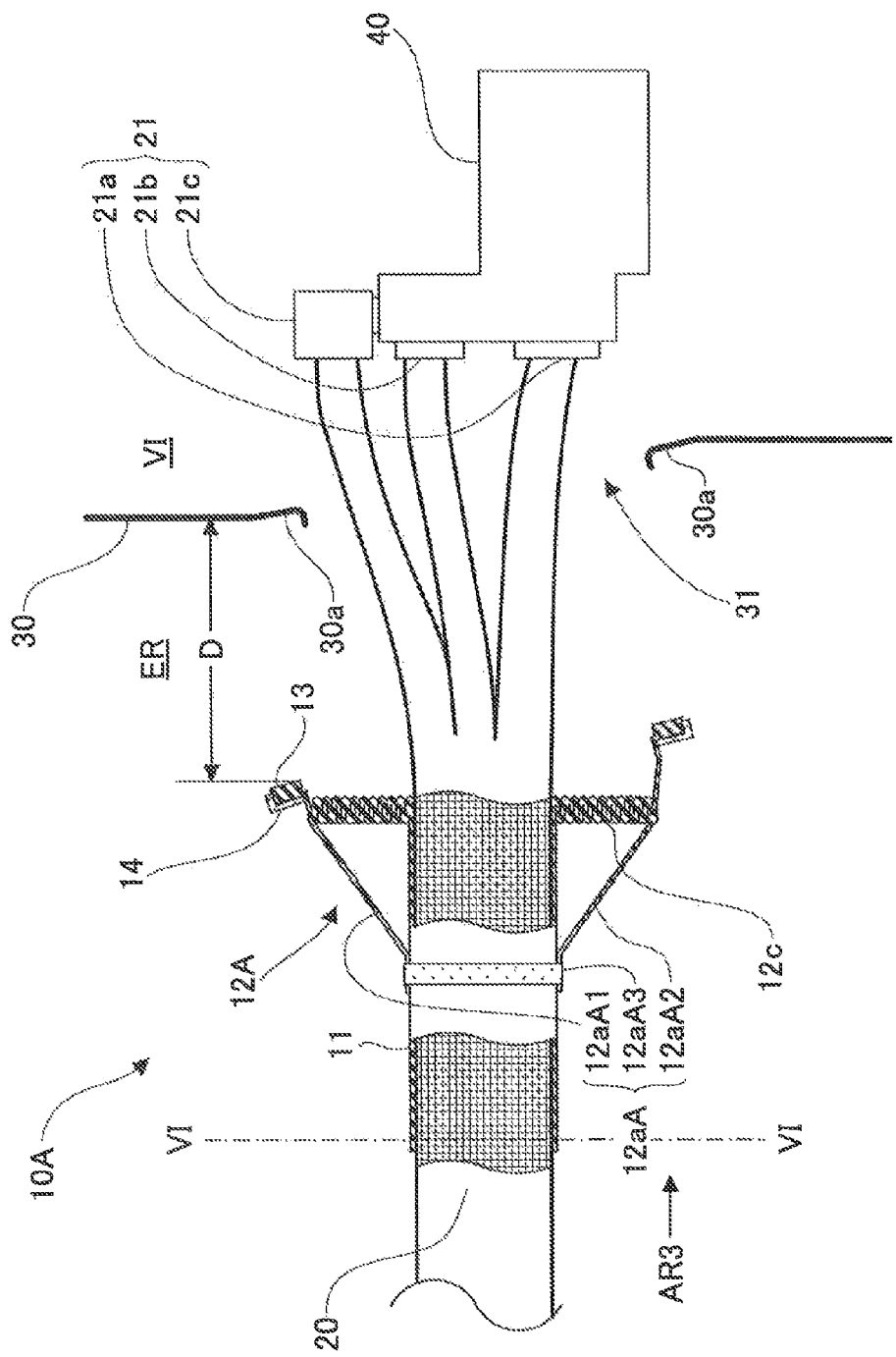
FIG. 5 is a partial cross-sectional view illustrating a configuration example of a grommet according to another embodiment of the present invention (before it is connected to a panel).
Figure 6:
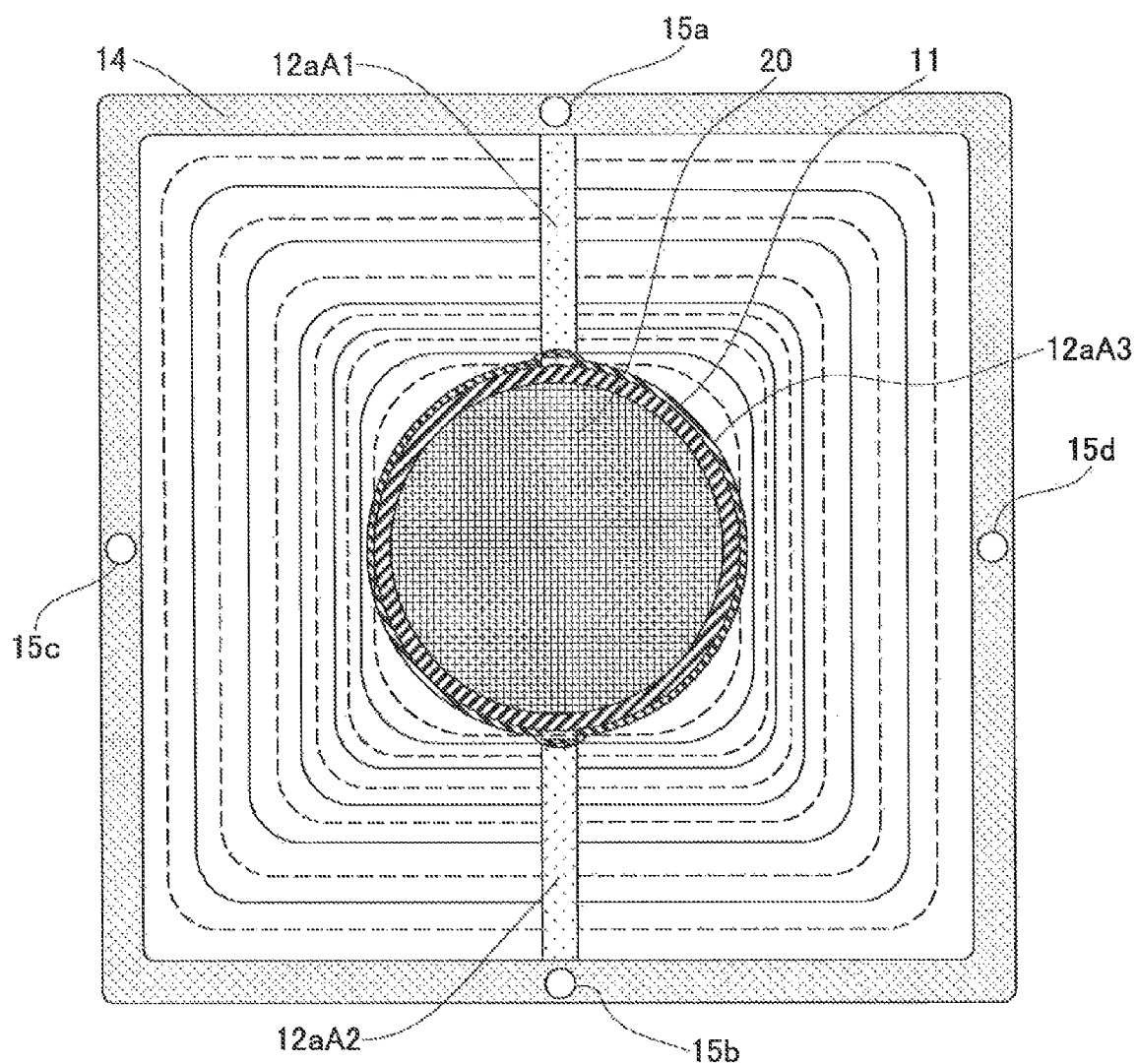
FIG. 6 is a diagram illustrating a plane defined by a line VI-VI in FIG. 5 viewed from a direction of an arrow AR3.

FIG. 5 is a partial cross-sectional view illustrating a configuration example of the grommet 10A according to another embodiment of the present invention, in which a whole extent of the grommet 10A and a part of a wire harness 20 are seen in cross-section (shadow areas). FIG. 5 shows a state before the grommet 10A is connected to a dash panel 30. Connectors 21 (21a, 21b, and 21c), at a tip of the wire harness 20 to which the grommet 10A is attached, pass through a panel opening 31 of the dash panel 30 from an engine room ER side at a front part of a vehicle. Also, the connectors 21 have been connected to corresponding connectors in a junction box 40 of an instrument panel installed in a vehicle interior VI (a space where an air conditioning unit and the like are installed). FIG. 6 is a diagram illustrating a plane defined by a line VI-VI in FIG. 5 viewed from a direction of an arrow AR3.

The grommet 10A is different from the grommet 10 in FIGS. 1-4 in that it has an intermediate extending part 12A provided with a bellows structure part 12c, and an extending-part-shape maintaining part 12aA for maintaining a state where the bellows structure part 12c is folded. However, other parts of the grommet 10A are in common with the grommet 10. Thus, an explanation relevant to the common points is omitted, and the differences will be explained in detail.

The intermediate extending part 12A is a shape-changeable flexible part (a part of the grommet 10A) extending between a wire harness connecting part 11 and a panel connecting part 13. The intermediate extending part 12A is provided with the bellows structure part 12c which changes its shape from a folded state where the panel connecting part 13 is held in a position away from the dash panel 30 more than a predetermined distance D (for example, 150 mm) when the connectors 21 of the wire harness 20 have been connected to the junction box 40, to a stretched state where the panel connecting part 13 is brought into close contact with the dash panel 30.

The extending-part-shape maintaining part 12aA is a component of the intermediate extending part 12. The extending-part-shape maintaining part 12aA is made of the same material (for example, an EPDM rubber) as other parts of the grommet 10A (the wire harness connecting part 11 and the panel connecting part 13). The extending-part-shape maintaining part 12aA includes bellows-structure-part folding tongue-parts 12aA1, 12aA2 and a tongue-part holding tape 12aA3.

The bellows-structure-part folding tongue-parts 12aA1, 12aA2 are configured to extend from joint parts between the bellows structure part 12c and the panel connecting part 13 in a direction opposite to the extending direction of the wire harness 20. The bellows-structure-part folding tongue-parts 12aA1, 12aA2 can maintain the folded state of the bellows structure part 12c by holding respective free ends in contact with an outer surface of the wire harness connecting part 11 while maintaining the folded state of the bellows structure part 12c.

The tongue-part holding tape 12aA3 is a holding member for holding the respective free ends of the bellows-structure-part folding tongue-parts 12aA1, 12aA2 in contact with the outer surface of the wire harness connecting part 11. For example, the tongue-part holding tape 12aA3 is an annular elastic member placed on an outer periphery of the wire harness 20 (the wire harness connecting part 11) stretchably.

The tongue-part holding tape 12aA3 may be made of material different from those of other parts of the grommet 10A.

Preferably, the grommet 10A is supplied in a state where the bellows structure part 12c of the intermediate extending part 12A is folded.

In the present embodiment, as shown in FIG. 6, the extending-part-shape maintaining part 12aA is configured to include the two bellows-structure-part folding tongue-parts 12aA1, 12aA2 placed at respective sides (upper and lower sides) of the wire harness 20 with respect to a central axis of the wire harness 20. However, the extending-part-shape maintaining part 12aA may include a single bellows-structure-part folding tongue-part or more than two bellows-structure-part folding tongue-parts.

Also, in the present embodiment, the bellows-structure-part folding tongue-parts 12aA1, 12aA2 are held in contact with the outer periphery of the wire harness 20 (the wire harness connecting part 11) by using the tongue-part holding tape 12aA3. However, the bellows-structure-part folding tongue-parts 12aA1, 12aA2 may be peelably held in contact with the outer periphery of the wire harness 20 (the wire harness connecting part 11) by using an adhesive such as a modified silicone resin adhesive.

Figure 7:
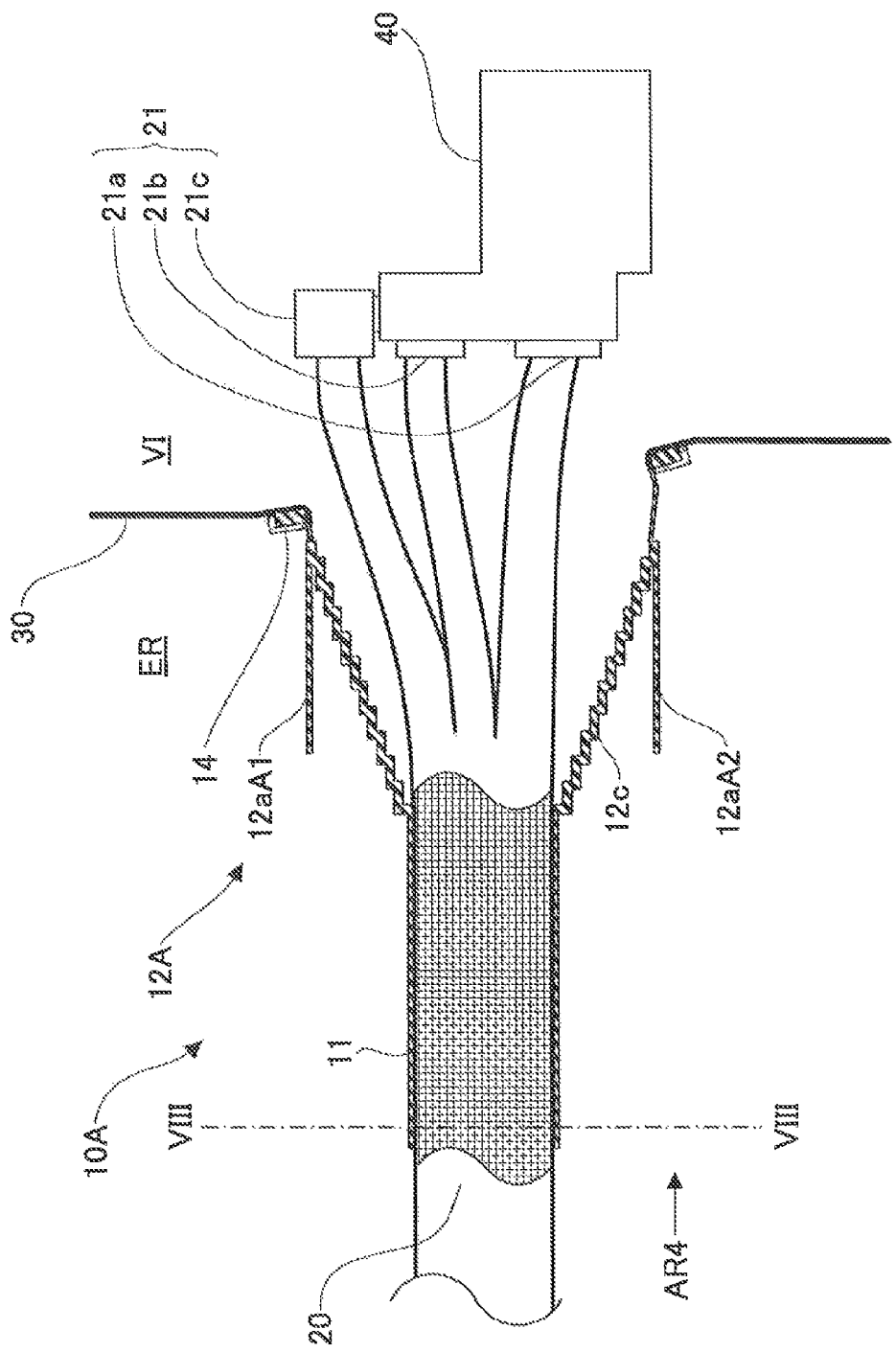
FIG. 7 is a partial cross-sectional view illustrating a state of the grommet in FIG. 5 after it is connected to the panel.
Figure 8:
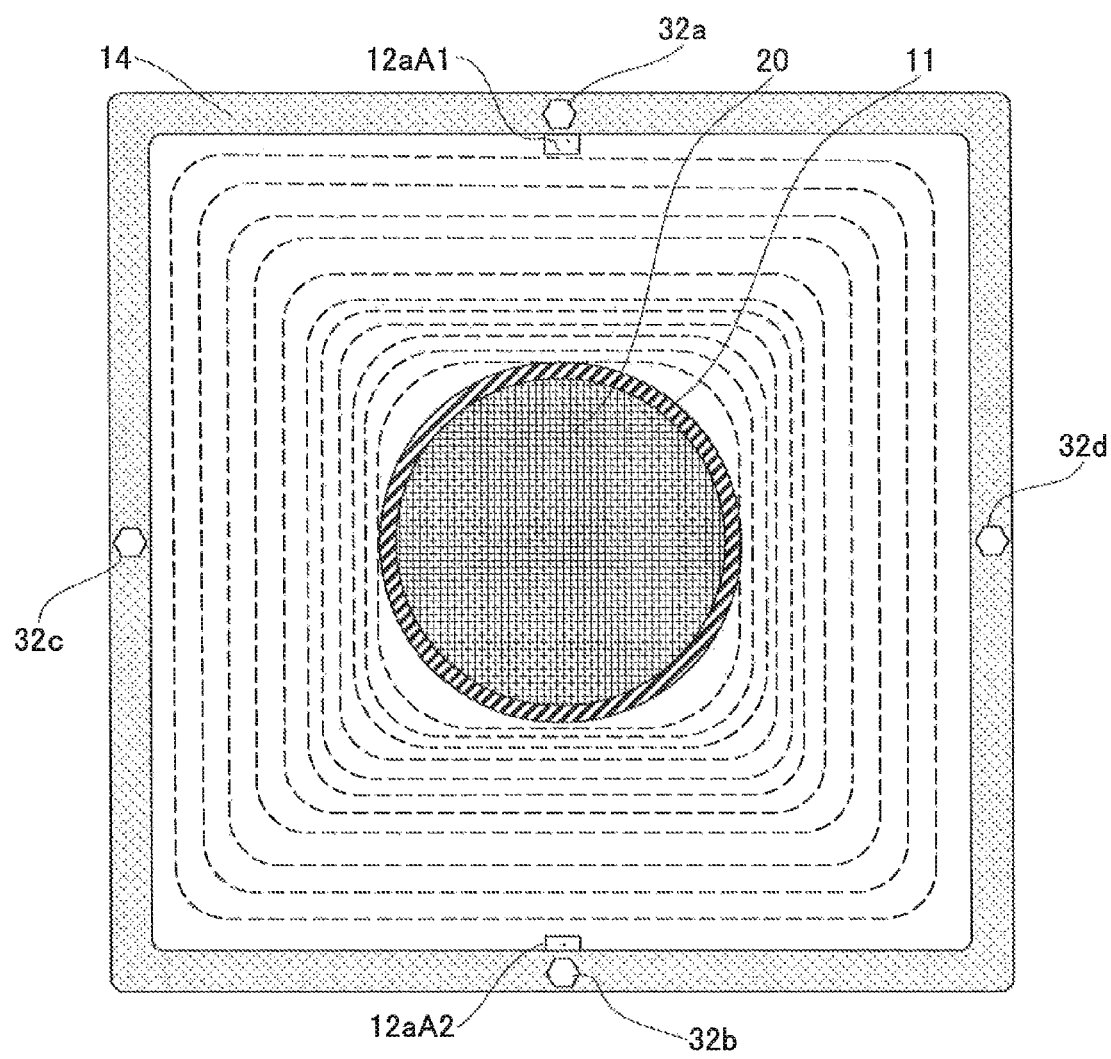
FIG. 8 is a diagram illustrating a plane defined by a line VIII-VIII in FIG. 7 viewed from a direction of an arrow AR4.

Along with FIG. 5, FIG. 7 is a partial cross-sectional view illustrating a configuration example of the grommet 10A. FIG. 7 shows a state after the grommet 10A has been connected to the dash panel 30. Also, FIG. 8 is a diagram illustrating a plane defined by a line VIII-VIII in FIG. 7 viewed from a direction of an arrow AR4.

After the worker has manually connected the connectors 21 of the wire harness 20 to the corresponding connectors in the junction box 40, the worker releases the respective free ends of the bellows-structure-part folding tongue-parts 12aA1, 12aA2 by cutting the tongue-part holding tape 12aA3, or by displacing the tongue-part holding tape 12aA3 in the direction opposite to the extending direction of the wire harness 20.

Subsequently, the worker stretches the bellows structure part 12c of the intermediate extending part 12 which is in the folded state as shown in FIG. 5 so that the bellows structure part 12c spreads toward the dash panel 30. Then, as shown in FIG. 7, the worker brings the panel connecting part 13 into close contact with an engine-room-side surface 30a (see FIG. 5) at the periphery of the panel opening 31 of the dash panel 30. And then, the worker fastens the panel connecting part 13, together with the plate part 14, to the dash panel 30 by using bolts 32a-32d (see FIG. 8) inserted into respective bolt holes 15a-15d (see FIG. 6) which pierce through the panel connecting part 13 and the plate part 14.

Also, the worker can manually fold again the bellows structure part 12c which has been extended in the direction toward the dash panel 30 as shown in FIG. 7. Then, the worker can hold again the respective free ends of the bellows-structure-part folding tongue-parts 12aA1, 12aA2 in contact with the outer surface of the wire harness connecting part 11 by using the tongue-part holding tape 12aA3 which has been displaced to the direction opposite to the extending direction of the wire harness 20. And thus, the worker can also return the bellows structure part 12c to the folded state as shown in FIG. 5.

Due to the above configuration, the grommet 10A holds the bellows structure part 12c of the intermediate extending part 12A at the folded state when the worker connects the connectors 21 of the wire harness 20 to the corresponding connectors in the junction box 40. Thus, the grommet 10A can make room for a work space for the connecting procedure without a special manual procedure by the worker, and can further improve the workability.

Also, the grommet 10A can go back and forth repeatedly between a state where the bellows structure part 12c has been folded and a state where the bellows structure part 12c has been stretched in case where the worker releases the bellows-structure-part folding tongue-parts 12aA1, 12aA2 from the outer surface of the wire harness connecting part 11 by displacing the tongue-part holding tape 12aA3. Thus, the worker can make room for a work space by folding the bellows structure part 12c even in the case where the worker starts over the connecting procedure of the connectors 21 of the wire harness 20 again after the worker has stretched the bellows structure part 12c.

Also, the grommet 10A can be stretched so that the bellows structure part 12c in the folded state spreads toward the dash panel 30. Thus, a size of an opening of the panel connecting part 13 can be set flexibly. And thus, the grommet 10A can fit into panel openings with a variety of sizes including a panel opening with relatively large size which allows plural connectors to pass through.

Also, the bellows structure part 12c may be configured to be stretched cylindrically along the wire harness 20 without spreading. In that case, a flat plate part having a size about equal to the size of the opening of the panel connecting part 13 may be placed at the joint part between the wire harness connecting part 11 and the intermediate extending part 12A (the bellows structure part 12c).

Also, as shown in FIG. 5, the bellows structure part 12c is held so that its folded part is piled up in a direction perpendicular to the outer surface of the wire harness 20. However, the bellows structure part 12c may be held so that its folded part is piled up in a direction parallel to the outer surface of the wire harness 20.

Also, the bellows structure part 12c may be held so that its folded part is piled up in the direction opposite to the extending direction of the wire harness 20 beyond the direction perpendicular to the outer surface of the wire harness 20.

The preferable embodiments of the present invention have been explained in detail. However, the present invention shall not be restricted to the above embodiments. Various changes and substitutions may be made to the above embodiments without departing from the scope of the present invention.

For example, in the above embodiment, the grommet 10A holds the bellows structure part 12c in the folded state by using the bellows-structure-part folding tongue-part 12aA1, 12aA2 and the tongue-part holding tape 12aA3. However, the grommet 10A may omit the bellows-structure-part folding tongue-part 12aA1, 12aA2 and the tongue-part holding tape 12aA3. In that case, the grommet 10A may hold the flexible intermediate extending part 12A without the bellows structure in a state rolled up toward the direction opposite to the extending direction of the wire harness 20, by peelably bonding a part thereof (for example, a joint part between the intermediate extending part 12A and the panel connecting part 13) to the outer surface of the wire harness connecting part 11 by using an adhesive.

Also, in the above embodiment, the grommet 10A may omit the bellows-structure-part folding tongue-part 12aA1, 12aA2 and the tongue-part holding tape 12aA3. On that basis, the grommet 10A may be configured to partially change thickness or flexibility of the intermediate extending part 12A. Thus, the grommet 10A can generate a certain shape-maintaining force which enables the folded state of the bellows structure part 12c to be maintained, and may allow the worker to exert a force on the bellows structure part 12c and to bring the panel connecting part 13 into close contact with the dash panel 30. And thus, when the worker gets his/her hands off of the bellows structure part 12c, the grommet 10A may allow the bellows structure part 12*c* to return to the folded state, and may allow the panel connecting part 13 to automatically get away from the dash panel 30 to a predetermined position. In this case, the intermediate extending part 12A does not have to employ the bellows structure part 12*c*. The intermediate extending part 12A may employ a structure which extends smoothly.

Also, in the above embodiments, the grommets 10, 10A are attached to the wire harness 20 having a circular cross-section. However, the grommets 10, 10A may be attached to a wire harness having other cross-sectional shapes such as an elliptical shape, a rectangle shape, or the like.

EXPLANATION OF REFERENCE NUMERALS

10, 10A grommet
11 wire harness
12, 12A intermediate extending part
12*a*, 12*a*A extending-part-shape maintaining part
12*a*A1, 12*a*A2 bellows-structure-part folding tongue-part
12*a*A3 tongue-part holding tape
12*b* curved part
12*c* bellows structure part
13 panel connecting part
14 plate part
15*a*-15*d* bolt hole
20 wire harness
21, 21*a*-21*c* connector
30 dash panel
30*a* dash panel surface
31 panel opening
32*a*-32*d* bolt
ER engine room
VI vehicle interior

The invention claimed is:

1. A grommet, comprising:
  a wire harness connecting part configured to be liquid-tightly connected to a wire harness,
  a panel connecting part configured to be able to be liquid-tightly connected to a panel opening,
  an extending part configured to shape-changeably extend between the wire harness connecting part and the panel connecting part,
  an extending-part-shape maintaining part configured to maintain a shape of the extending part in a state where a distance between the wire harness connecting part and the panel connecting part in a length direction of the wire harness is shorter than that of the case where the panel connecting part is liquid-tightly connected to the panel opening.

2. A grommet according to claim 1, wherein the extending-part-shape maintaining part comprises a shape-maintaining structure configured to maintain the shape of the extending part in a state where the extending part is rolled up.

3. A grommet according to claim 2, wherein the shape-maintaining structure can switch between a state where the extending part has been rolled up toward the wire harness connecting part and a state where the extending part has been rolled out toward the panel connecting part.

4. A grommet according to claim 1, wherein the extending part comprises a bellows structure, and the extending-part-shape maintaining part maintains the shape of the extending part in a state where the bellows structure of the extending part is folded up.

5. A method of mounting a grommet to a panel opening, the grommet comprising a wire harness connecting part configured to be liquid-tightly connected to a wire harness, a panel connecting part configured to be able to be liquid-tightly connected to a panel opening, an extending part configured to shape-changeably extend between the wire harness connecting part and the panel connecting part, and an extending-part-shape maintaining part configured to maintain a shape of the extending part, the method comprising steps of:
  connecting a connector at a tip of the wire harness and a corresponding connector disposed in the panel opening while maintaining by the extending-part-shape maintaining part the shape of the extending part in a state where a distance between the wire harness connecting part and the panel connecting part in a length direction of the wire harness is shorter than that of the case where the panel connecting part is liquid-tightly connected to the panel opening, and
  coupling the panel connecting part to the panel opening by lengthening the distance through changing the shape of the extending part.

* * * * *